US012628285B2

(12) United States Patent
Choi et al.

(10) Patent No.: US 12,628,285 B2
(45) Date of Patent: May 12, 2026

(54) EXTERNAL DATA STORAGE DEVICE

(71) Applicant: SK hynix Inc., Gyeonggi-do (KR)

(72) Inventors: Nam Hyeon Choi, Gyeonggi-do (KR);
Seung Yeob Baek, Gyeonggi-do (KR);
Jun Heum Bae, Gyeonggi-do (KR);
Dong Hae Lee, Gyeonggi-do (KR)

(73) Assignee: SK hynix Inc., Gyeonggi-do (KR)

( * ) Notice: Subject to any disclaimer, the term of this
patent is extended or adjusted under 35
U.S.C. 154(b) by 128 days.

(21) Appl. No.: 18/532,786

(22) Filed: Dec. 7, 2023

(65) Prior Publication Data

US 2024/0365480 A1 Oct. 31, 2024

(30) Foreign Application Priority Data

Apr. 26, 2023 (KR) ........................ 10-2023-0054618

(51) Int. Cl.
| | |
|---|---|
| *H05K 5/00* | (2025.01) |
| *G06F 1/16* | (2006.01) |
| *G06F 1/18* | (2006.01) |
| *G06F 1/187* | (2026.01) |
| *G06F 1/20* | (2006.01) |
| *G11B 23/02* | (2006.01) |
| *H05K 5/02* | (2006.01) |
| *H05K 7/20* | (2006.01) |

(52) U.S. Cl.
CPC ............. *H05K 5/0091* (2013.01); *G06F 1/16*
(2013.01); *G06F 1/187* (2013.01); *G06F 1/20*
(2013.01); *G11B 23/021* (2013.01); *H05K
5/0204* (2013.01); *H05K 5/0213* (2013.01);
*H05K 7/20127* (2013.01); *H05K 5/0256*
(2013.01)

(58) Field of Classification Search
CPC .. H05K 5/0091; H05K 5/0204; H05K 5/0213;
H05K 7/20127; H05K 5/0256; G06F
1/16; G06F 1/187; G06F 1/20
See application file for complete search history.

(56) References Cited

U.S. PATENT DOCUMENTS

| | | | | |
|---|---|---|---|---|
| 5,694,290 A | * | 12/1997 | Chang ................... | G11B 33/025 |
| 5,749,637 A | * | 5/1998 | McMahan .............. | A47B 91/00 |
| | | | | 248/688 |

(Continued)

FOREIGN PATENT DOCUMENTS

| | | |
|---|---|---|
| KR | 10-0475455 B1 | 4/2005 |
| KR | 10-1364789 B1 | 2/2014 |

(Continued)

OTHER PUBLICATIONS

Concord, Heat Transfer Convection, 2013, Concord Consortium,
https://concord.org/wp-content/uploads/2016/12/projects/eee/solar-
house/EEE-Ch2.3-sim-teacher.pdf (Year: 2013).*

(Continued)

*Primary Examiner* — Rockshana D Chowdhury
*Assistant Examiner* — Martin Antonio Asmat Uceda
(74) *Attorney, Agent, or Firm* — IP & T GROUP LLP

(57) ABSTRACT

The present technology provides an external data storage
device comprising: a memory module including a plurality
of semiconductor chips suitable for storing data received
from an external device; a case including a plurality of
surfaces surrounding the memory module; and a case stand
suitable for supporting the case in an approximately vertical
direction on a ground.

15 Claims, 22 Drawing Sheets

(56) References Cited

U.S. PATENT DOCUMENTS

| | | | | |
|---|---|---|---|---|
| 6,288,893 | B1 * | 9/2001 | Faranda | G06K 13/0825 |
| | | | | 345/905 |
| 6,407,913 | B1 * | 6/2002 | Peachey | G06F 1/187 |
| | | | | 361/679.33 |
| 6,483,107 | B1 * | 11/2002 | Rabinovitz | G06F 1/184 |
| 6,535,384 | B2 * | 3/2003 | Huang | G11B 33/124 |
| | | | | 361/679.48 |
| 6,790,066 | B1 * | 9/2004 | Klein | H01R 13/6395 |
| | | | | 439/271 |
| 6,929,337 | B2 * | 8/2005 | Helot | G06F 1/181 |
| | | | | 312/351.8 |
| 7,729,111 | B2 * | 6/2010 | Le | G11B 33/025 |
| | | | | 248/163.1 |
| 8,164,849 | B1 * | 4/2012 | Szeremeta | G11B 33/123 |
| | | | | 360/97.19 |
| 8,254,096 | B2 * | 8/2012 | Liao | G06F 1/1601 |
| | | | | 361/679.02 |
| 8,405,976 | B2 * | 3/2013 | Liu | G11B 33/142 |
| | | | | 361/695 |
| 9,123,686 | B2 * | 9/2015 | Mataya | H01L 23/3677 |
| 9,958,914 | B2 * | 5/2018 | Kim | G06F 1/20 |
| 10,937,464 | B2 * | 3/2021 | Long | G11B 33/142 |
| 11,547,018 | B2 * | 1/2023 | Muto | H05K 7/20472 |
| 2003/0206402 | A1 * | 11/2003 | Tsuyuki | G11B 33/128 |
| 2004/0255313 | A1 * | 12/2004 | Kaczeus, Sr. | G06F 1/184 |
| | | | | 720/651 |
| 2008/0130219 | A1 * | 6/2008 | Rabinovitz | G11B 33/1426 |
| | | | | 361/679.31 |
| 2009/0009953 | A1 * | 1/2009 | Lin | G06F 1/1632 |
| | | | | 361/679.33 |
| 2010/0164836 | A1 * | 7/2010 | Liberatore | G06F 1/1696 |
| | | | | 345/1.1 |
| 2013/0277515 | A1 * | 10/2013 | Pan | G11B 33/124 |
| | | | | 248/224.8 |
| 2020/0174533 | A1 * | 6/2020 | Long | H05K 7/20145 |
| 2021/0092871 | A1 * | 3/2021 | Hur | H05K 7/20163 |
| 2024/0114660 | A1 * | 4/2024 | Yarragunta | H05K 5/0213 |

FOREIGN PATENT DOCUMENTS

| | | |
|---|---|---|
| KR | 10-2014-0138680 A | 12/2014 |
| KR | 10-2015-0087530 A | 7/2015 |
| KR | 10-2018-0135798 A | 12/2018 |
| KR | 10-2020-0144882 A | 12/2020 |
| KR | 10-2021-0152914 A | 12/2021 |
| KR | 10-2355620 B1 | 1/2022 |
| KR | 10-2022-0106175 A | 7/2022 |

OTHER PUBLICATIONS

Fusion F&C Lumax LC-100K Campimg LED Lantern, Mission PC, [retrieved on Sep. 14, 2022]. Retrieved from the Internet: https://smartstore.naver.com/missonpc/products/4964842663?NaPm=ct%3DI81564pk%7Cci%3D7bf5eb06e831319b9ea761cb7a9ed6b89b6bc756%7Ctr%3Dimg%7Csn%3D257528%7Chk%3Daaa6cbbf9c14e3ca0de66d77236e4653a0b0200e>.

Office Action for Korean Patent Application No. 10-2023-0054618 issued by the Korean Patent Office on Jul. 9, 2025.

Notice of Allowance for Korean Patent Application No. 10-2023-0054618 issued by the Korean Patent Office on Mar. 20, 2026.

* cited by examiner

1<sup>st</sup> direction

2<sup>nd</sup> direction

200B

230B

215

300B

1000B

200B

300B

1000B axis of rotation                    230B

1000C

<u>1000C</u>

<u>1000C</u>

EXTERNAL DATA STORAGE DEVICE

CROSS-REFERENCE TO RELATED APPLICATION

This patent application claims the benefit of priority under 35 U. S. C. § 119(a) to Korean Patent Application No. 10-2023-0054618 filed on Apr. 26, 2023, which is incorporated herein by reference in its entirety.

BACKGROUND

1. Field

Various embodiments of the present invention relate to an external data storage device, and more particularly to an external data storage device that can be positioned in an approximately vertical direction on the ground, to improve the heat dissipation performance.

2. Discussion of the Related Art

An external data storage device has excellent data storage and data transfer performance. However, if the external data storage device is operated for a long time and overheats, its performance may be degraded, or its lifespan may be reduced. As external data storage devices become increasingly miniaturized, heat dissipation performance is becoming increasingly important.

SUMMARY

Various embodiments of the present invention are directed to an apparatus capable of improving heat dissipation performance.

Technical problems to be achieved in the present invention are not limited to the aforementioned technical problems and the other unmentioned technical problems will be clearly understood by those skilled in the art from the following description.

Various embodiments of the present invention are directed to providing a memory device, a memory system, a controller included in the memory system, or a data processing system including the memory system.

In an embodiment of the present invention, an external data storage device may comprise a memory module including a plurality of semiconductor chips suitable for storing data received from an external device; a case including a plurality of surfaces surrounding the memory module; and a case stand suitable for supporting the case in an approximately vertical direction on a ground.

The case may further include a thermal vent, which is formed in an uppermost surface of the case to dissipate heat generated by the memory module, and wherein the uppermost surface may be the farthest from the ground among the surfaces of the case when the case is positioned vertically on the ground by the case stand.

The case may further include an air inlet, which is formed in a lowermost surface of the case and configured to introduce air into the case, and wherein the lowermost surface may be the closest to the ground among the surfaces of the case when the case is positioned vertically on the ground by the case stand.

In an embodiment of the present invention an external data storage device may comprise: a memory module including a plurality of semiconductor chips including a plurality of memory cell arrays; a case including a plurality of surfaces surrounding the memory module; and a case stand suitable for supporting the case from the ground, wherein an angle formed by the case and the case stand varies with reference to a rotation axis formed by a coupling of the case and the case stand, and wherein a first planar surface and a second planar surface, which have the largest sizes among the plurality of surfaces, are supported from the ground by the case stand.

The case may further include a thermal vent, which is formed in an uppermost surface of the case to dissipate heat generated by the memory module, and wherein the uppermost surface is the farthest from the ground among the surfaces of the case when the case is positioned vertically on the ground by the case stand.

The case may further include an air inlet, which is formed in a lowermost surface of the case and configured to introduce air into the case, and wherein the lowermost surface is the closest to the ground among the surfaces of the case when the case is positioned vertically on the ground by the case stand.

Aspects of the present invention include some embodiments of the present invention. Various embodiments into which technical characteristics of the present invention have been incorporated may be derived and understood by a person having ordinary knowledge in the art based on the detailed description of the present invention.

The above aspects of the invention include some of the preferred embodiments of the invention, and various embodiments incorporating the technical features of the invention may be derived and understood by one having ordinary skill in the art from the detailed description of the invention that follows.

Furthermore, according to an embodiment of the present invention, the external data storage device may be used by standing approximately vertically on the ground to improve the heat dissipation performance by utilizing thermal radiation and the convection phenomenon.

To improve the heat dissipation performance by utilizing thermal radiation and the convection phenomenon, the embodiments of the present invention may provide an external data storage device in which a thermal vent is formed.

To improve the heat dissipation performance by utilizing thermal radiation and the convection phenomenon, the embodiments of the present invention may provide an external data storage device in which the air inlet and thermal vent are formed.

Effects of the present invention which may be obtained in the present invention are not limited to the aforementioned effects and other effects not described above may be evidently understood by a person having ordinary knowledge in the art to which the present invention pertains from the following description.

These and other features and advantages of the invention will become apparent from the detailed description of embodiments of the invention and the following figures.

3

Figure 4A:
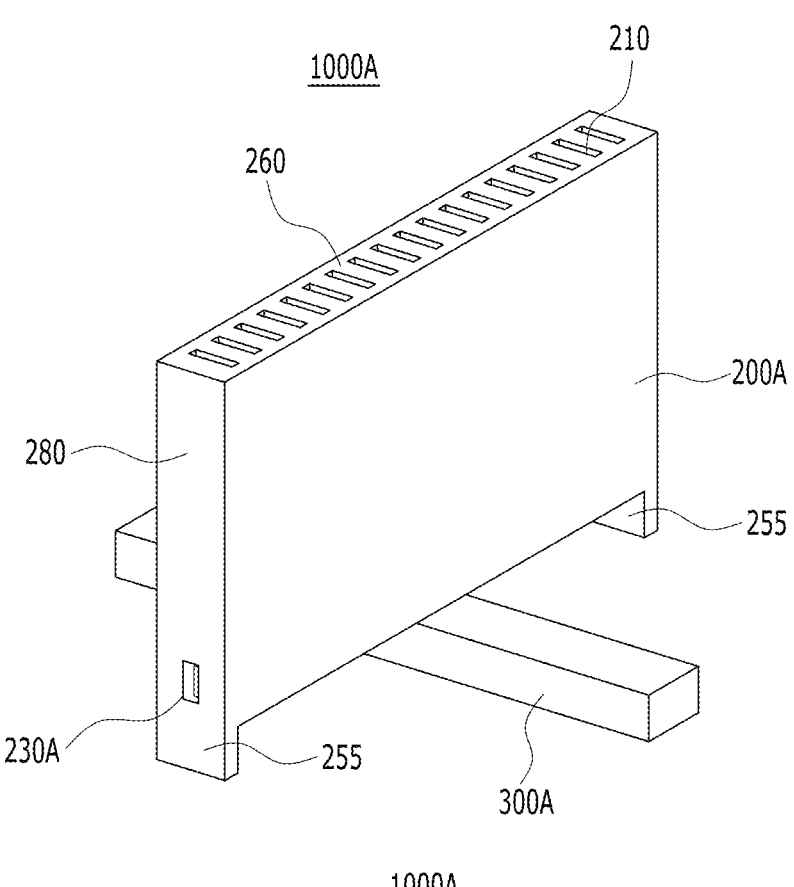
Figure 4B:
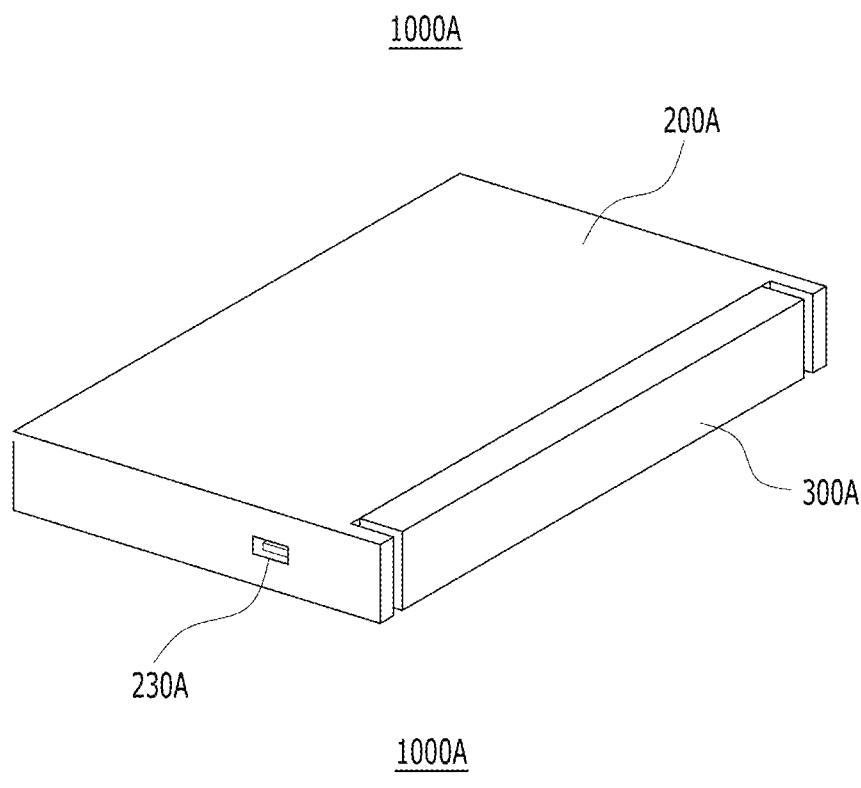

FIGS. 4A and 4B illustrate an external data storage device according to an embodiment of the present invention.

Figure 5A:
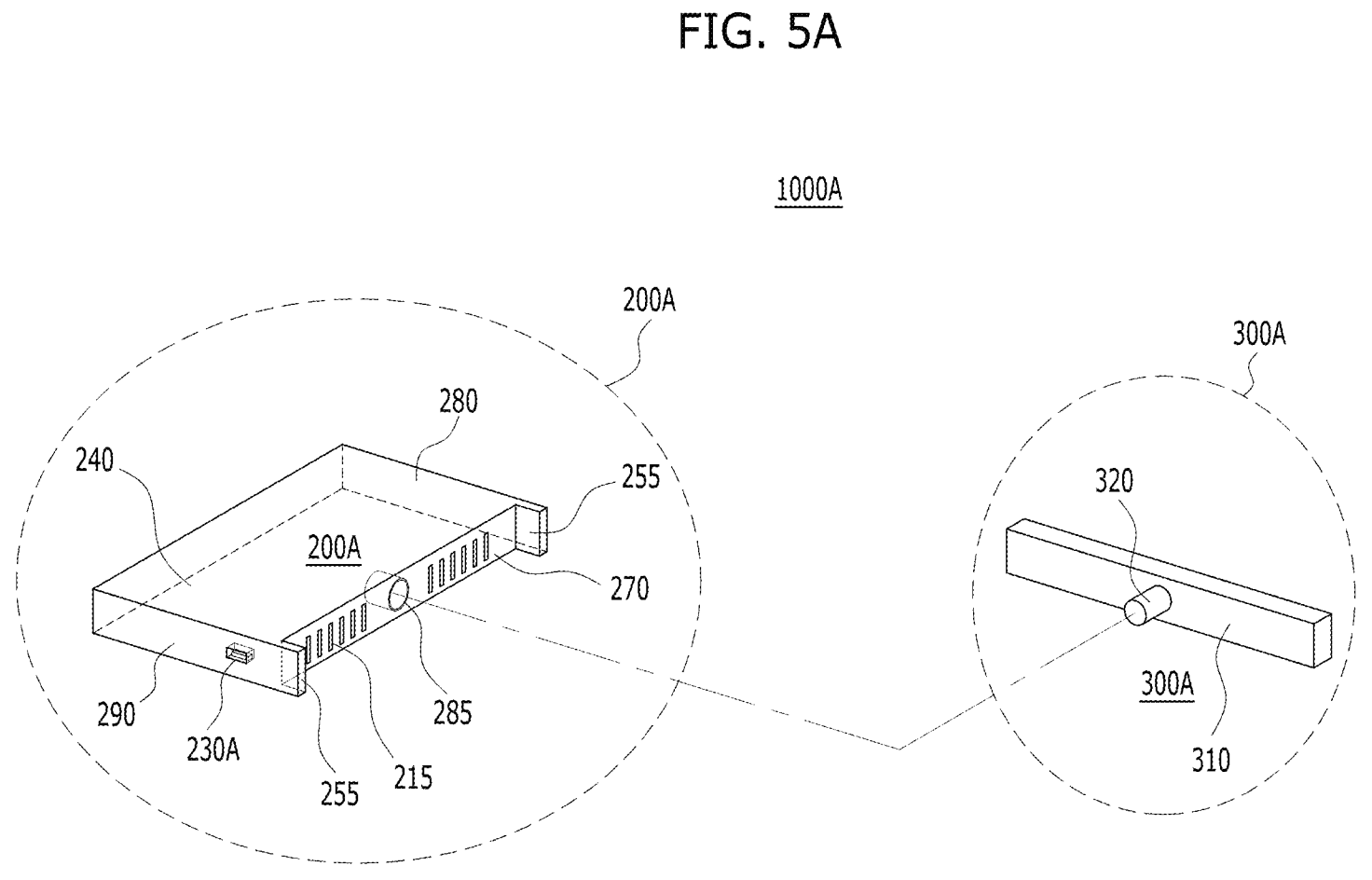
Figure 5B:
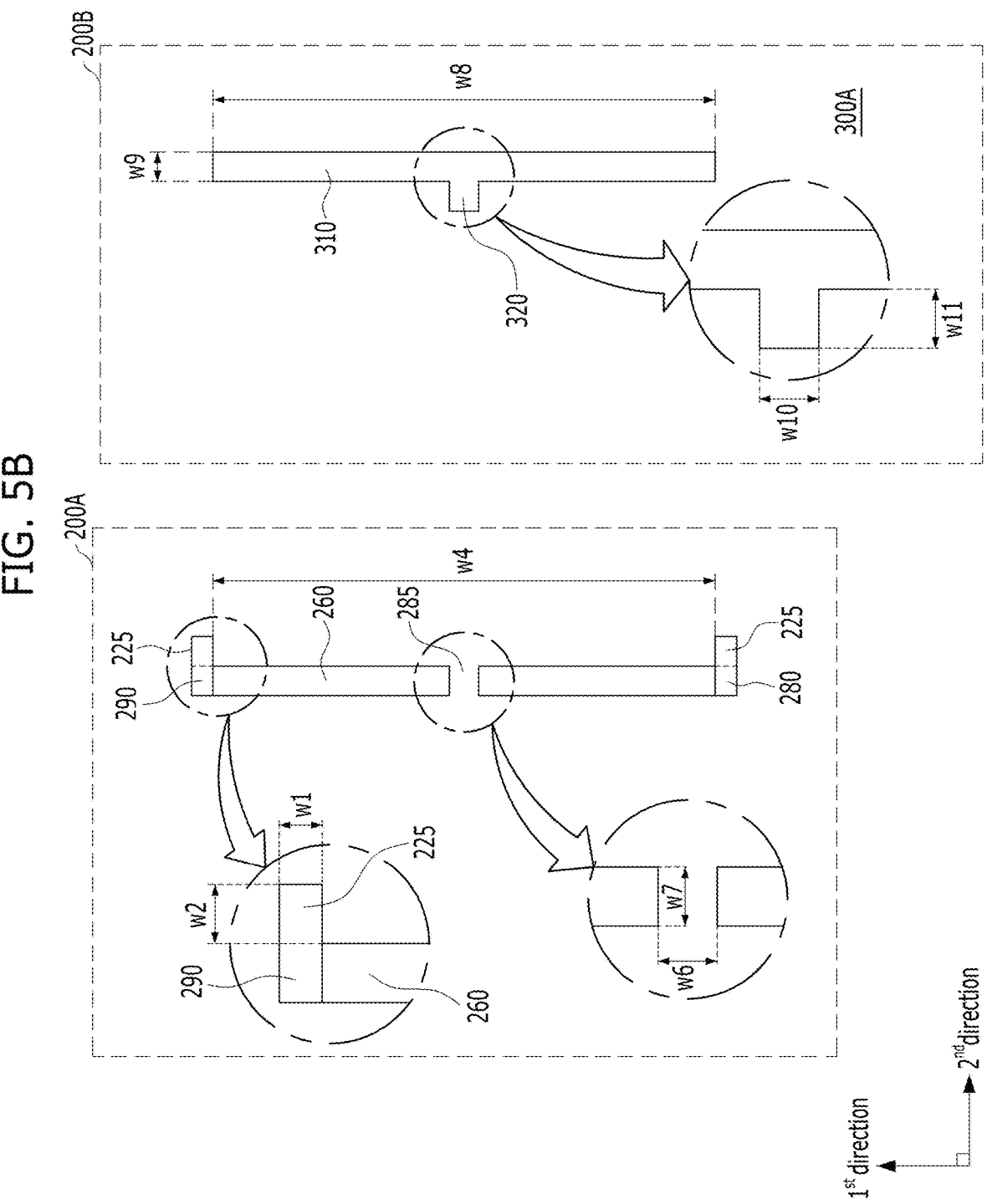

FIGS. 5A and 5B illustrate a coupling process of an external data storage device as shown in FIGS. 4A and 4B.

Figure 6A:
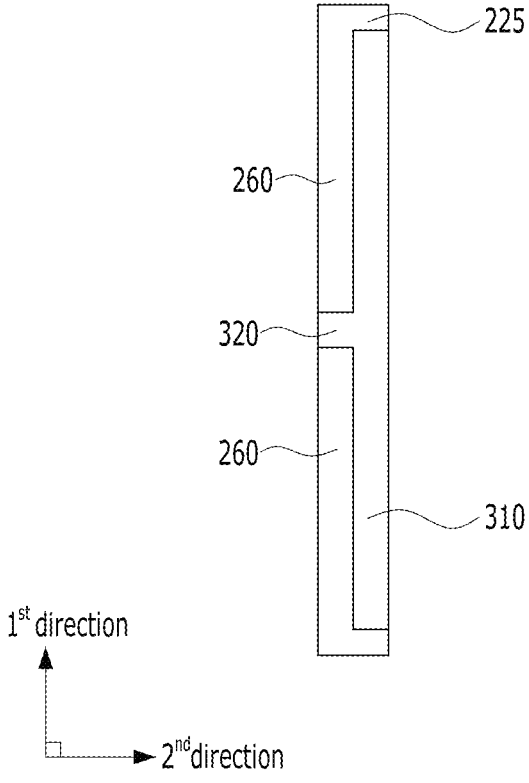
Figure 6B:
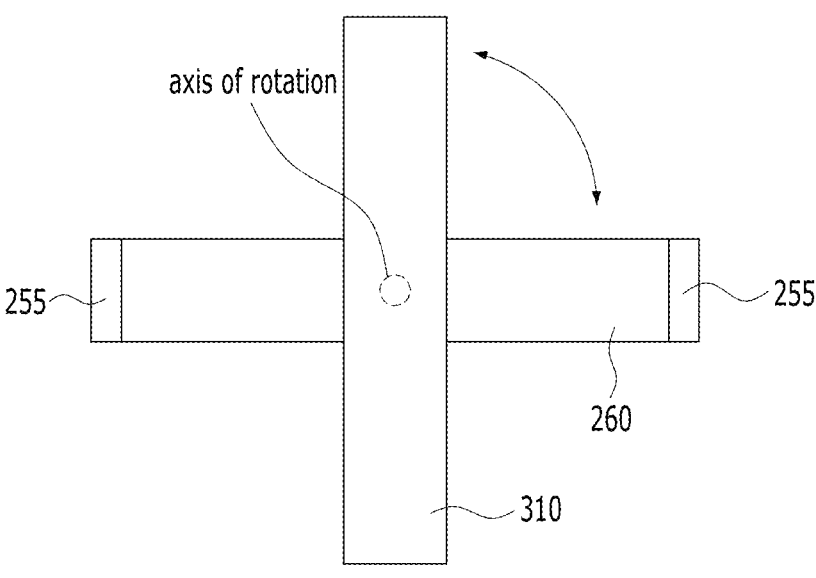

FIGS. 6A and 6B illustrate a coupled structure of an external data storage device as shown in FIGS. 4A and 4B.

Figure 7A:
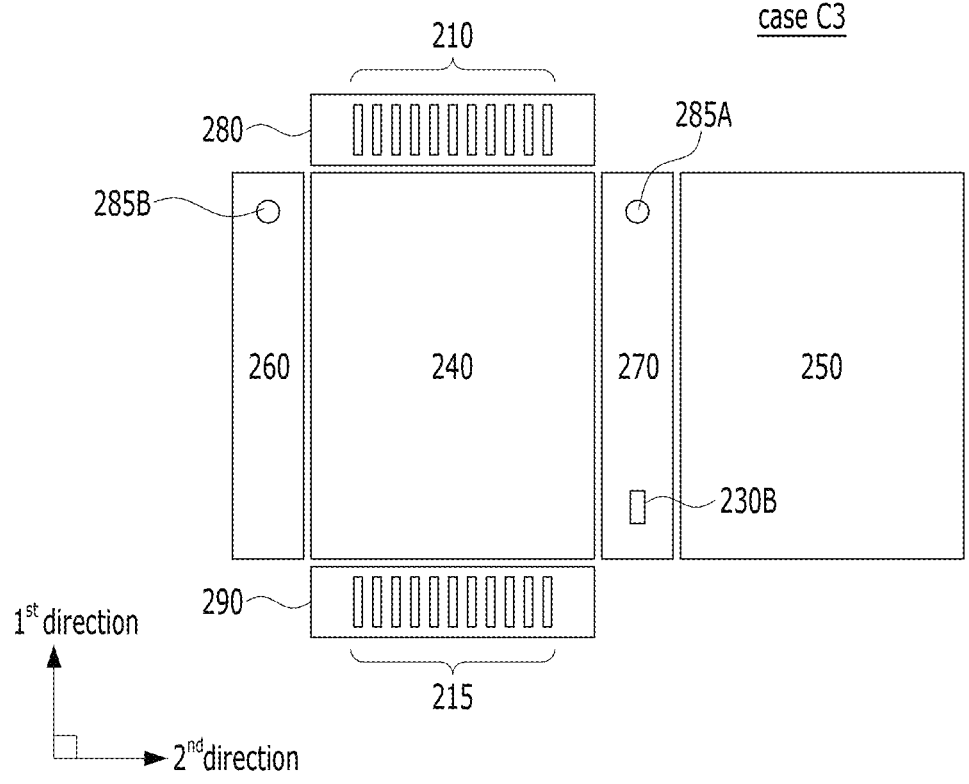
Figure 7B:
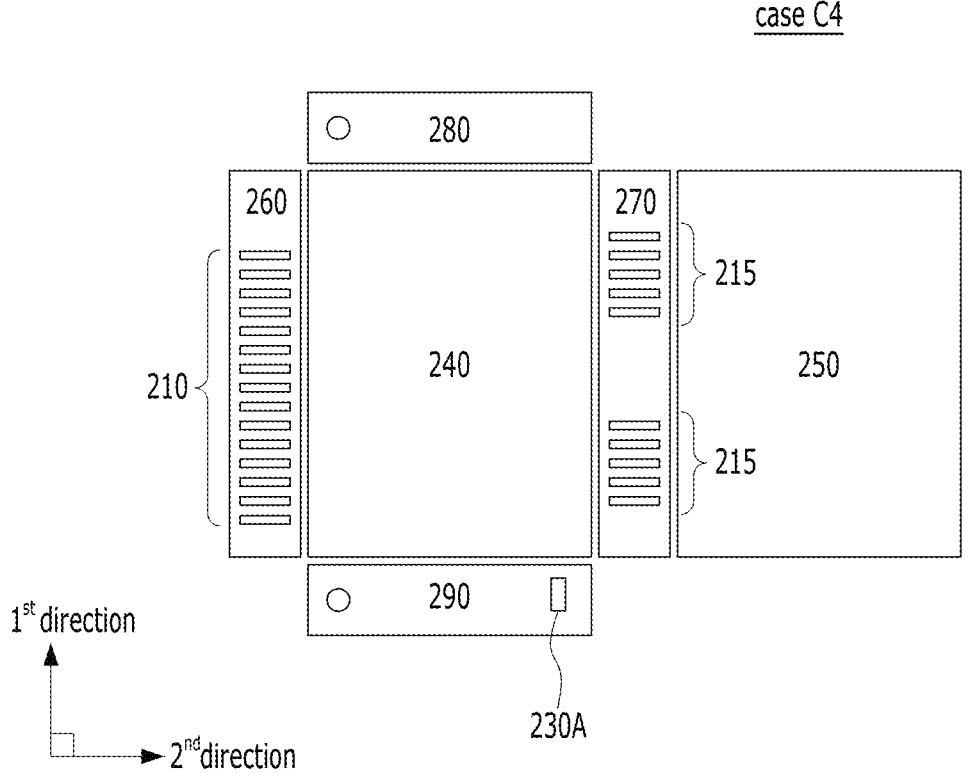

FIGS. 7A and 7B illustrate cases according to another embodiment of the present invention.

Figure 8A:
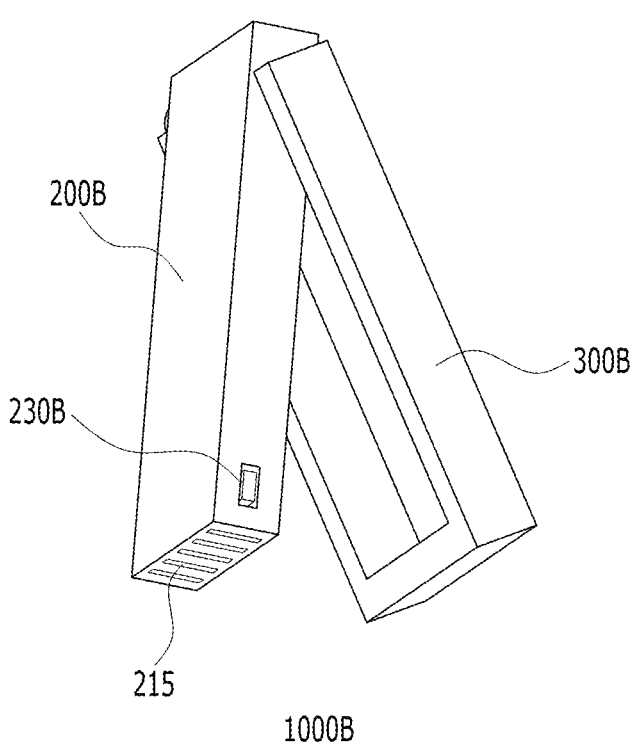
Figure 8B:
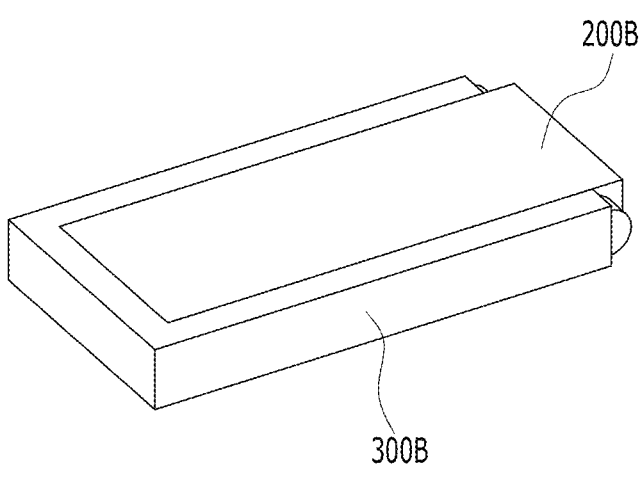

FIGS. 8A and 8B illustrate an external data storage device according to another embodiment of the present invention.

Figure 9:
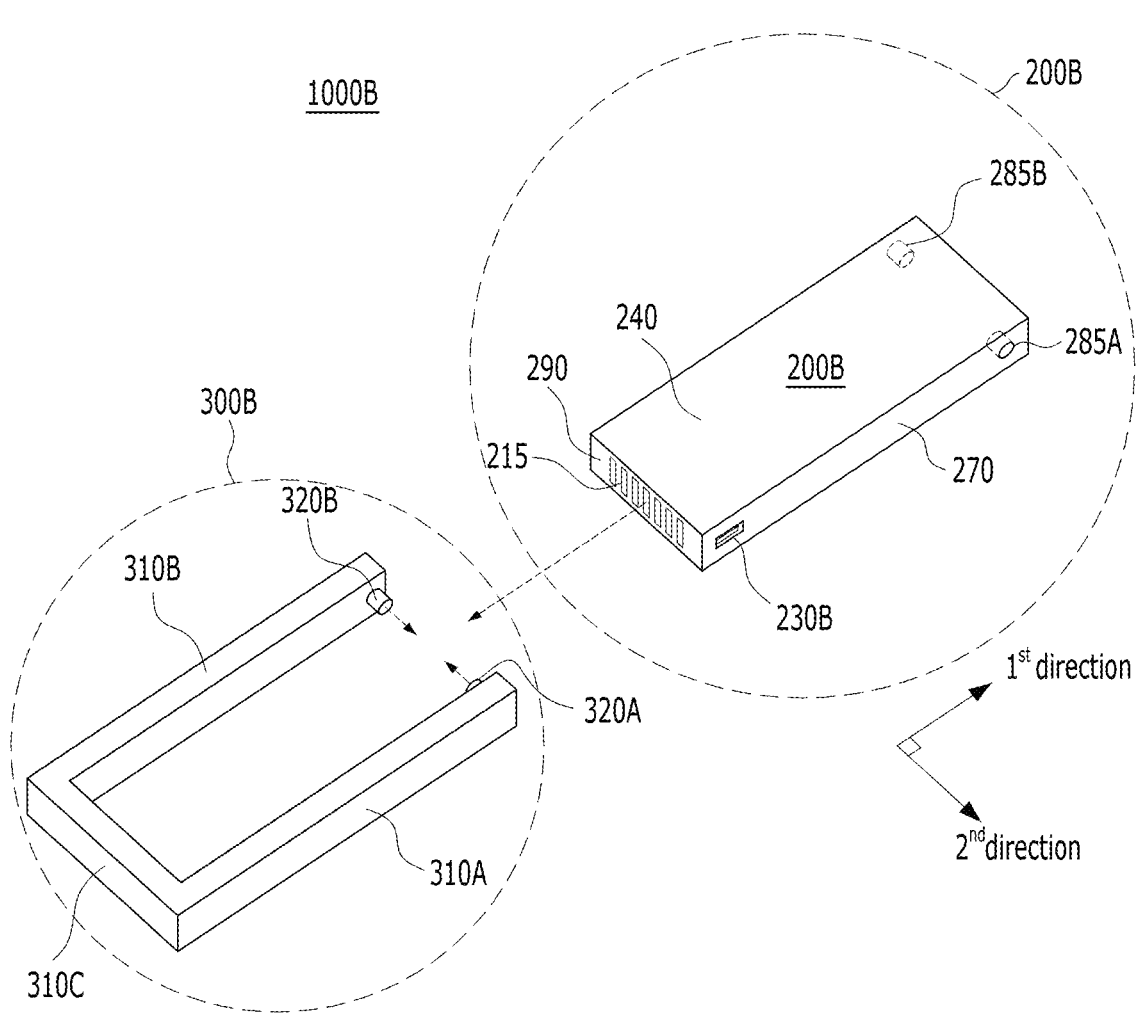

FIG. 9 illustrates a first embodiment of a coupling process of an external data storage device as shown in FIGS. 8A and 8B.

Figure 10:
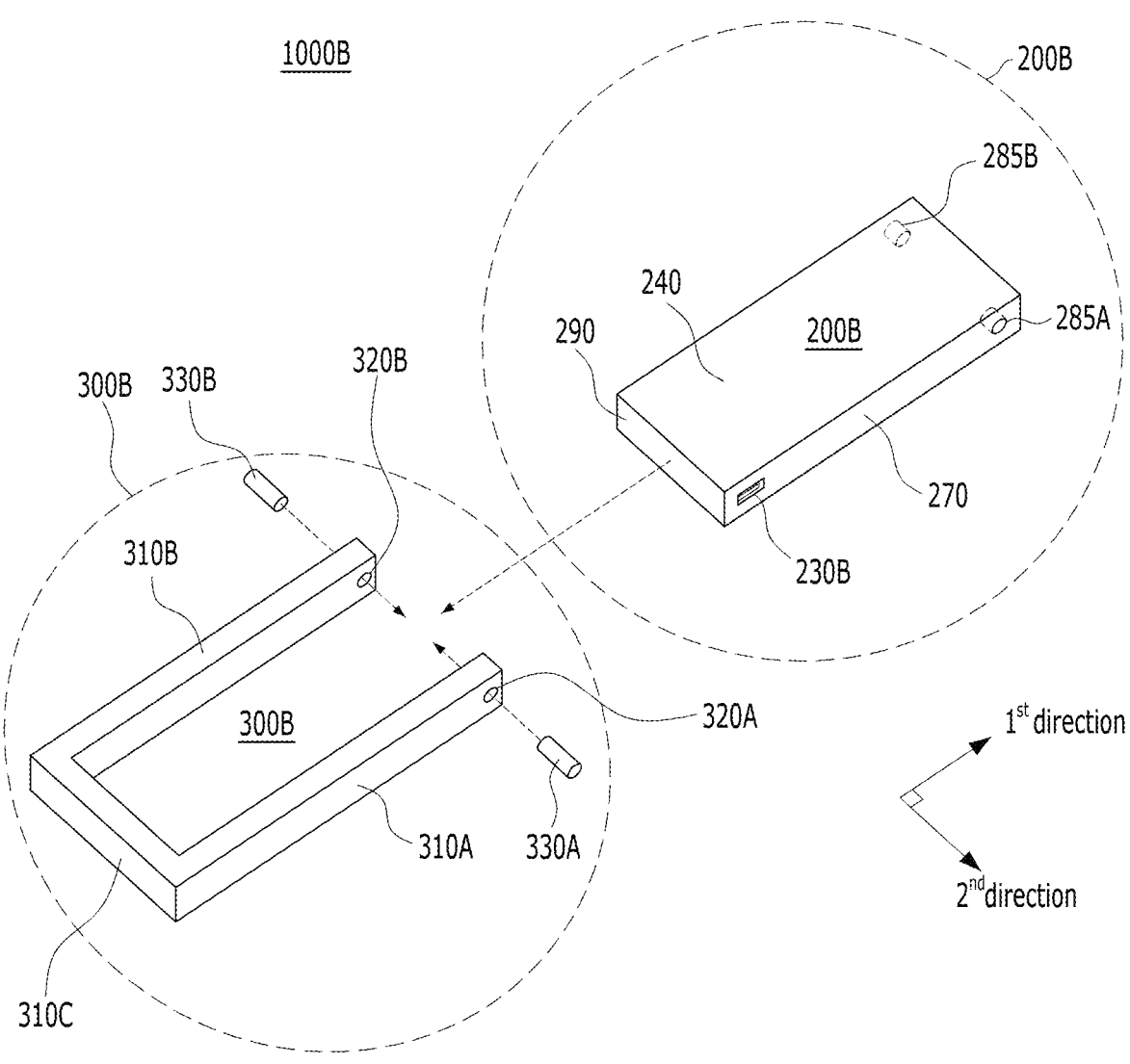

FIG. 10 illustrates a second embodiment of a coupling process of an external data storage device as shown in FIGS. 8A and 8B.

Figure 11A:
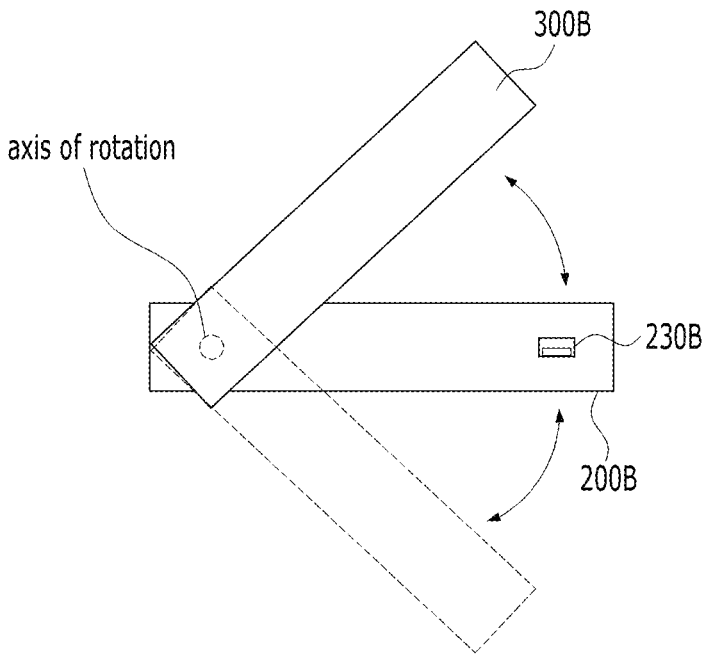
Figure 11B:
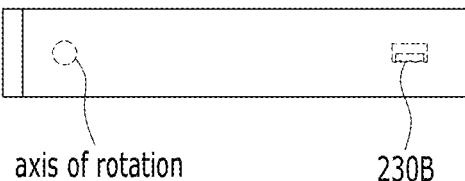

FIGS. 11A and 11B illustrate a coupled structure of an external data storage device as shown in FIGS. 8A and 8B.

Figure 12A:
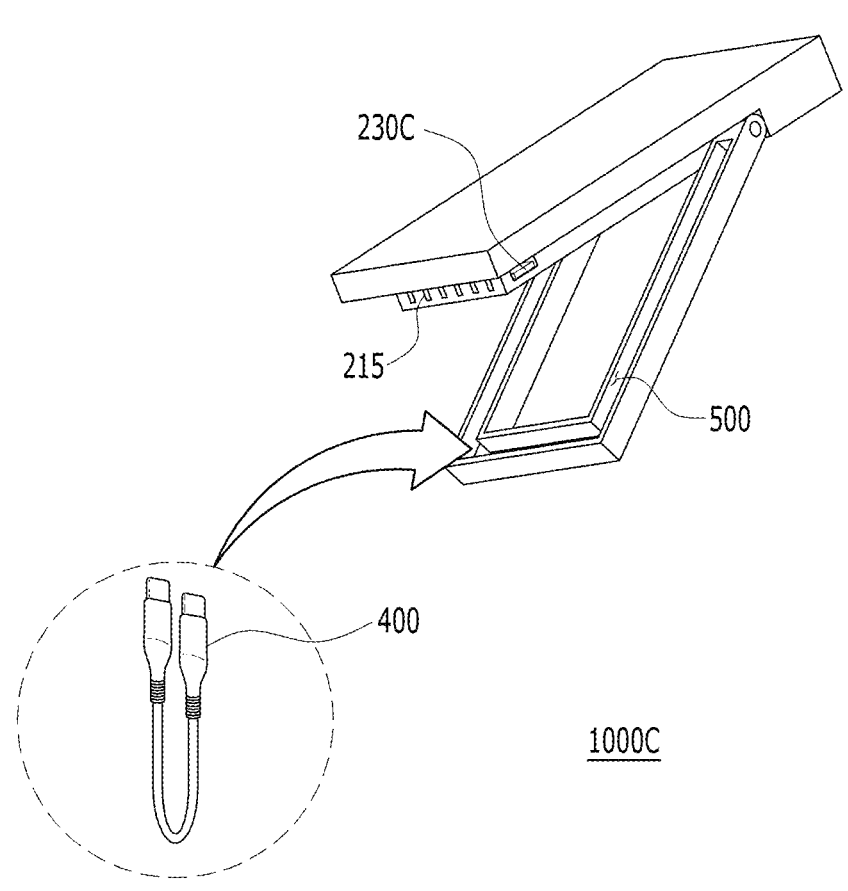
Figure 12B:
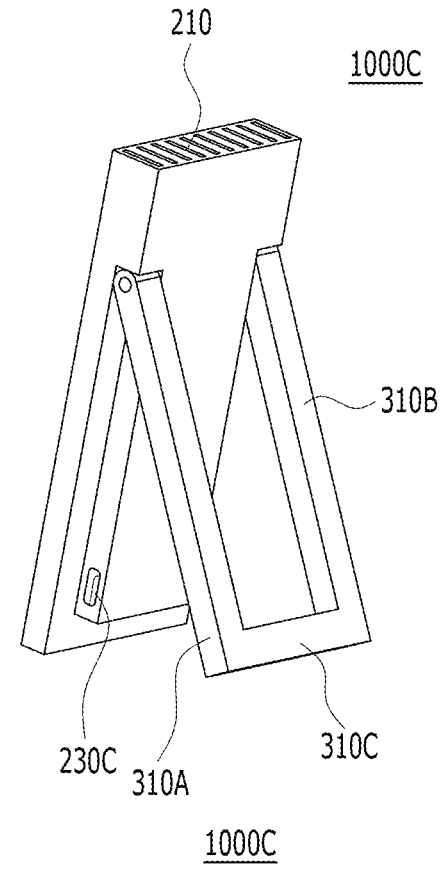
Figure 12C:
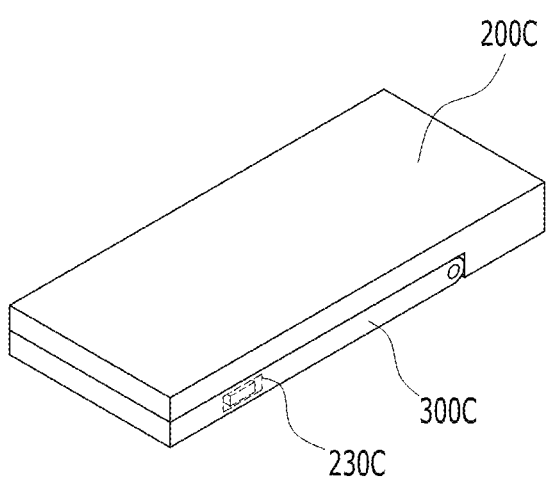

FIGS. 12A through 12C illustrate variant embodiments of the external data storage device as shown in FIGS. 8A and 8B.

DETAILED DESCRIPTION

Various embodiments of the present invention are described below with reference to the accompanying drawings. Elements and features of this disclosure, however, may be configured or arranged differently to form other embodiments, which may be variations of any of the embodiments.

In this disclosure, references to various features (e.g., elements, structures, modules, components, steps, operations, characteristics, etc.) included in 'an embodiment,' 'example embodiment,' 'an embodiment,' 'another embodiment,' 'some embodiments,' 'various embodiments,' 'other embodiments,' 'alternative embodiment,' and the like are intended to mean that any such features are included in one or more embodiments of the present invention, but may or may not necessarily be coupled in the same embodiments.

In this disclosure, the terms 'comprise,' 'comprising,' 'include,' and 'including' are open-ended. As used in the appended claims, these terms specify the presence of the stated elements and do not preclude the presence or addition of one or more other elements. The terms in a claim do not prevent the apparatus from including additional components (e.g., an interface unit, circuitry, etc.).

In this disclosure, various units, circuits, or other components may be described or claimed as 'configured to' perform a task or tasks. In such contexts, 'configured to' is used to connote structure by indicating that the blocks/units/ circuits/components include structure (e.g., circuitry) that performs one or more tasks during operation. As such, the block/unit/circuit/component may be said to be configured to perform the task even when the specified block/unit/ circuit/component is not currently operational (e.g., is not turned on nor activated). The block/unit/circuit/component used with the 'configured to' language include hardware, for example, circuits, memory storing program instructions executable to implement the operation, etc. Additionally, 'configured to' can include a generic structure (e.g., generic circuitry) that is manipulated by software and/or firmware (e.g., an FPGA or a general-purpose processor executing software) to operate in manner that is capable of performing the task(s) at issue. 'Configured to' may also include adapting a manufacturing process (e.g., a semiconductor fabrication facility) to fabricate devices (e.g., integrated circuits) that are adapted to implement or perform one or more tasks.

As used herein, the terms 'first,' 'second,' 'third,' and so on are used as labels for nouns that they precede, and do not imply any type of ordering (e.g., spatial, temporal, logical, etc.). The terms 'first' and 'second' do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term 'based on' is used to describe one or more factors that affect a determination. This term does not foreclose additional factors that may affect a determination. That is, a determination may be solely based on those factors or based, at least in part, on those factors. Consider the phrase 'determine A based on B'. While in this case, B is a factor that affects the determination of A, such a phrase does not foreclose the determination of A from also being based on C. In other instances, may be determined based solely on B.

Embodiments described herein provide an apparatus and a method capable of maintaining the performance of a memory device or a data storage device included in a data storage structure or a data infrastructure.

In embodiments of the present invention, heat is regarded as emitted and dissipated through processes of heat conduction, thermal radiation, and thermal convection.

Figure 1:
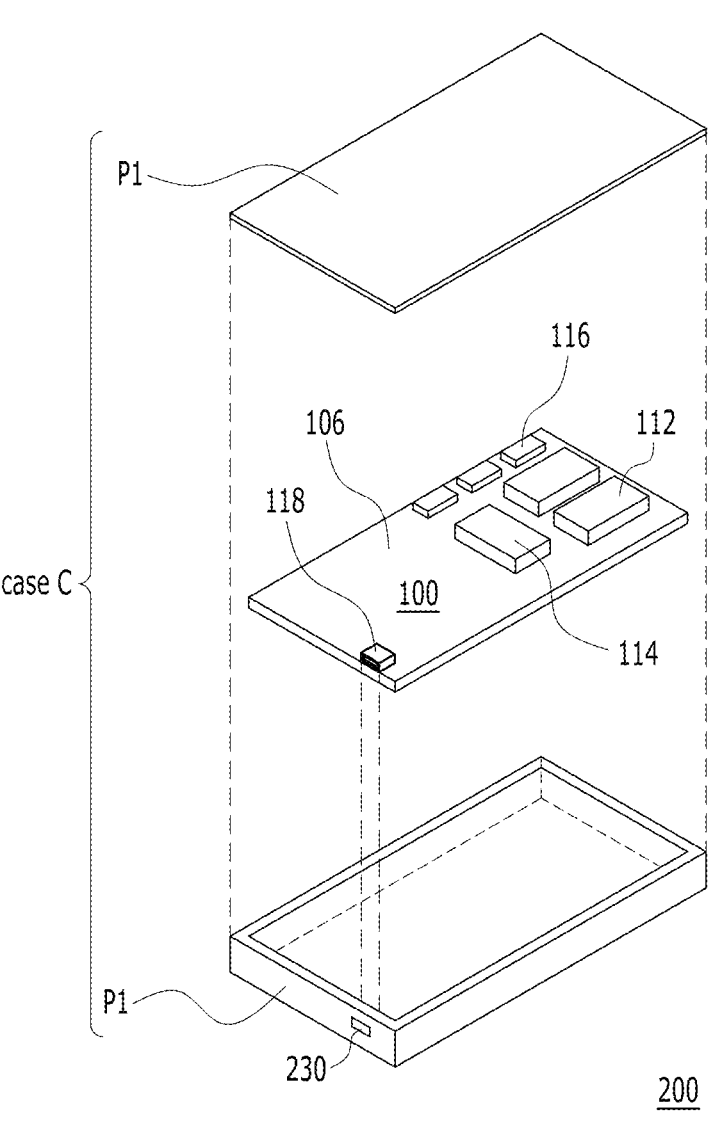
FIG. 1 illustrates an internal structure of an external data storage device according to the embodiments of the present invention.

FIG. 1 illustrates an internal structure of an external data storage device case 200 according to the embodiments of the present invention. The external data storage device case 200 may include a memory module 100 and a case C.

The memory module 100 may include a plurality of non-volatile memory cell arrays (not shown) that store data received from an external device (not shown).

Referring to FIG. 1, the memory module 100 includes a printed circuit board PCB to which a plurality of first semiconductor chips 112, a plurality of second semiconductor chips 116, and a third semiconductor chip 114 are attached. Wires are formed on the PCB to establish electrical connections between the first semiconductor chips 112, the second semiconductor chips 116, and the third semiconductor chip 114. In embodiments of the present invention, the memory module 100 may include a solid-state drive (SSD), but the present invention is not limited to this configuration.

The first semiconductor chip 112 may include a plurality of non-volatile memory cell arrays. The second semiconductor chip 116 may include a plurality of volatile memory cell arrays. The third semiconductor chip 114 may control data input/output operations for the first and second semiconductor chips 112 and 114.

According to an embodiment, the PCB includes a connector 118, which serves as an interface device for receiving power from the external device and performing data communication with the external device. For example, the connector 118 may include at least one pin to connect to a socket of the external device, such as a rack or board. The connector 118 may include a Universal Serial Bus (USB) connector, but the present invention is not limited to this configuration.

The case C may be designed to embed the memory module 100. The case C may include a first portion P1 covering a top portion of the memory module 100, and a second portion P2 covering a bottom portion of the memory module 100.

The case C not only protects the memory module 100 from external impacts, but also dissipates the heat generated by the memory module 100 to the outside.

The first and second portions P1 and P2 are coupled to each other by a coupling mechanism such as a screw, a snap-fit, or the like. If the memory module 100 malfunctions, the first and second portions P1 and P2 may be removed to replace the malfunctioning PCB with a functioning PCB.

The second portion P2 may include a connector hole 230 that exposes the connector 118 formed on the PCB to the outside. A cable associated with the external device may be connected to the connector 118 of the memory module 100, through the connector hole 230.

Although not shown, the external data storage device case 200 may further include a heat sink (not shown) surrounding the memory module 100. The heat sink may be made of metallic materials such as aluminum and copper, or other highly thermally conductive materials, to further enhance the heat dissipation performance. A heat transfer material, such as a thermal pad or a thermal grease, may be applied inside of the heat sink to improve the heat dissipation performance.

Furthermore, to enhance moisture and water resistance, silicone or Teflon may be added to the coupling portion of the first and second portions P1 and P2. Alternatively, to prevent water or moisture from penetrating the memory module 100, a vapor barrier material, such as a potting compound, may be used to fill the gap between the memory module 100 and the heat sink.

Consequently, the external data storage device case 200 can prevent water and moisture from entering the memory module 100 without affecting the heat dissipation performance.

Figure 2A:
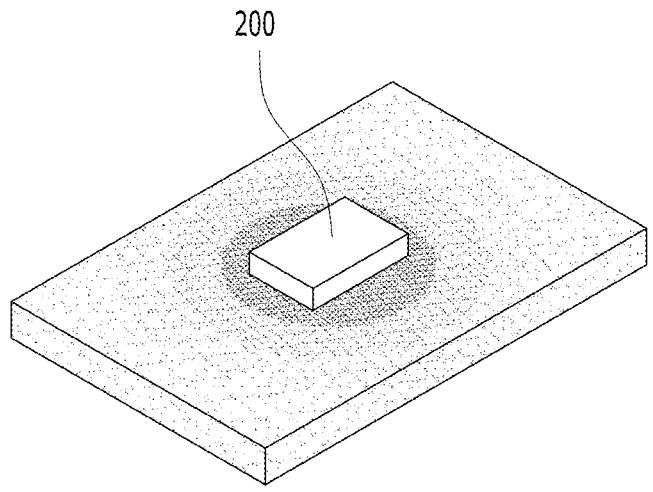
FIGS. 2A and 2B illustrate temperatures according to placement of an external data storage device according to the embodiments of the present invention.
Figure 2B:
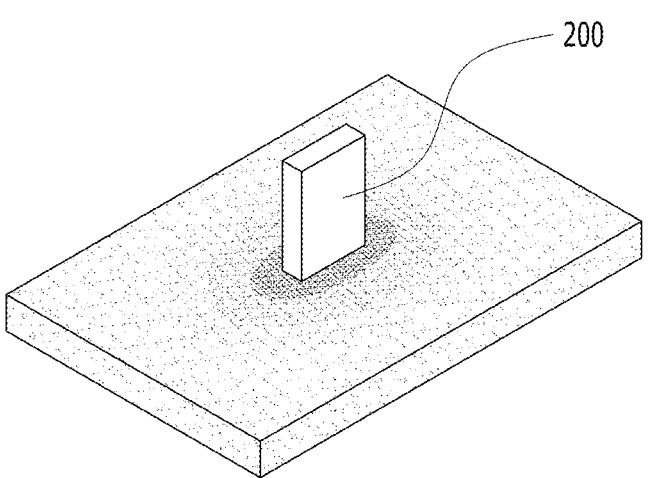

FIGS. 2A and 2B illustrate temperatures according to a placement of the external data storage device case 200. FIG. 2A illustrates the external data storage device case 200 in operation, positioned horizontally on the ground. FIG. 2B illustrates the external data storage device case 200 in operation, positioned vertically on the ground. The external data storage device case 200 includes the memory module 100 and the case C. The memory module 100 is embedded inside the case C.

The measured temperatures TEMP_1 and TEMP_2 of the external data storage device case 200 are as shown in 'TABLE' below. All temperatures were measured under the same experimental conditions, such as ambient temperature and measurement equipment.

A first temperature TEMP_1 represents a temperature of the operating external data storage device case 200 when positioned horizontally on the ground, as shown in FIG. 2A. A second temperature TEMP_2 represents a temperature of the operating external data storage device case 200 when positioned vertically on the ground, as shown in FIG. 2B.

TABLE

| Measuring position | TEMP_1 | TEMP_2 | Difference |
|---|---|---|---|
| chip 112 | 81.9 | 78.5 | 3.4 |
| chip 116 | 84.6 | 81.9 | 2.7 |
| chip 114 | 85.8 | 84.5 | 1.3 |
| case C | 53.9 | 51.9 | 2 |

Referring to the TABLE, the second temperature TEMP_2 is lower than the first temperature TEMP_1.

The horizontal external data storage device case 200 may have a larger contact area with the ground than the vertical external data storage device case 200 and may have less surface area exposed to the air than the vertical external data storage device case 200. The vertical external data storage device case 200 may have a smaller contact area with the ground than the horizontal external data storage 1*o* device case 200 and may have greater surface area exposed to the air than the horizontal external data storage device case 200. Accordingly, the heat dissipation performance of the vertical external data storage device case 200 may be improved compared to the horizontal external data storage device case 200.

However, a center of gravity of the vertical external data storage device case 200 is positioned higher than that of the horizontal external data storage device case 200. A contact area with the ground is smaller than that of the horizontal external data storage device case 200. Therefore, a structural stability of the vertical external data storage device case 200 may be lower compared to the horizontal external data storage device case 200.

Hereinafter, an external data storage device 1000A according to an embodiment of the present invention will be described with reference to FIGS. 3A to 6B. In the following description, overlap details with FIGS. 1 to 2B will be omitted.

Figure 3A:
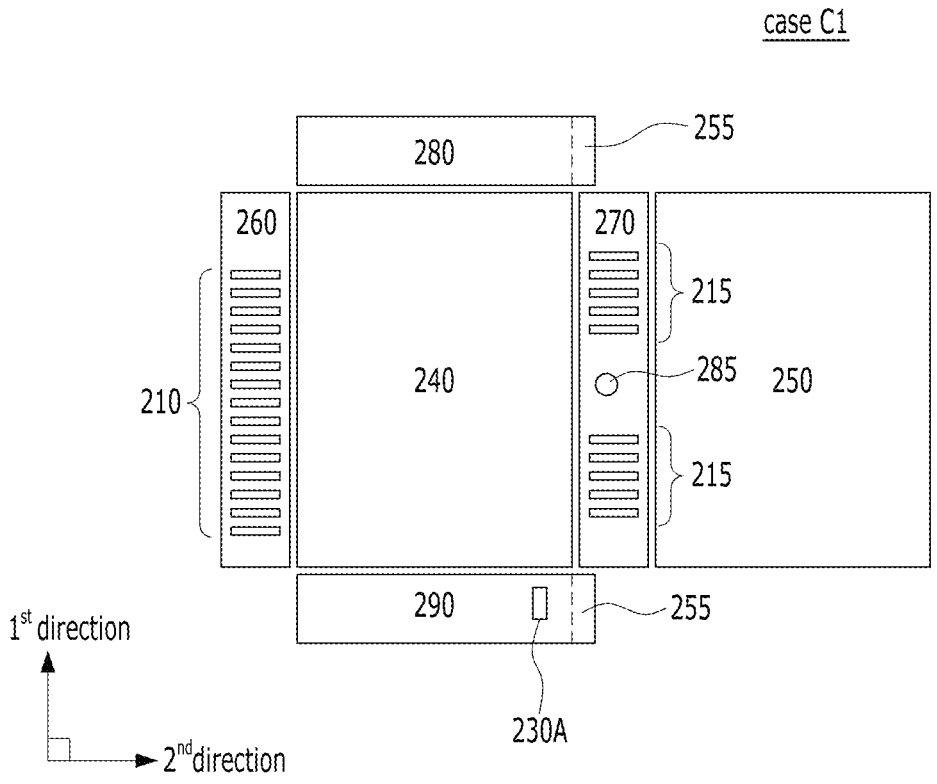
FIGS. 3A and 3B illustrate cases according to an embodiment of the present invention.
Figure 3B:
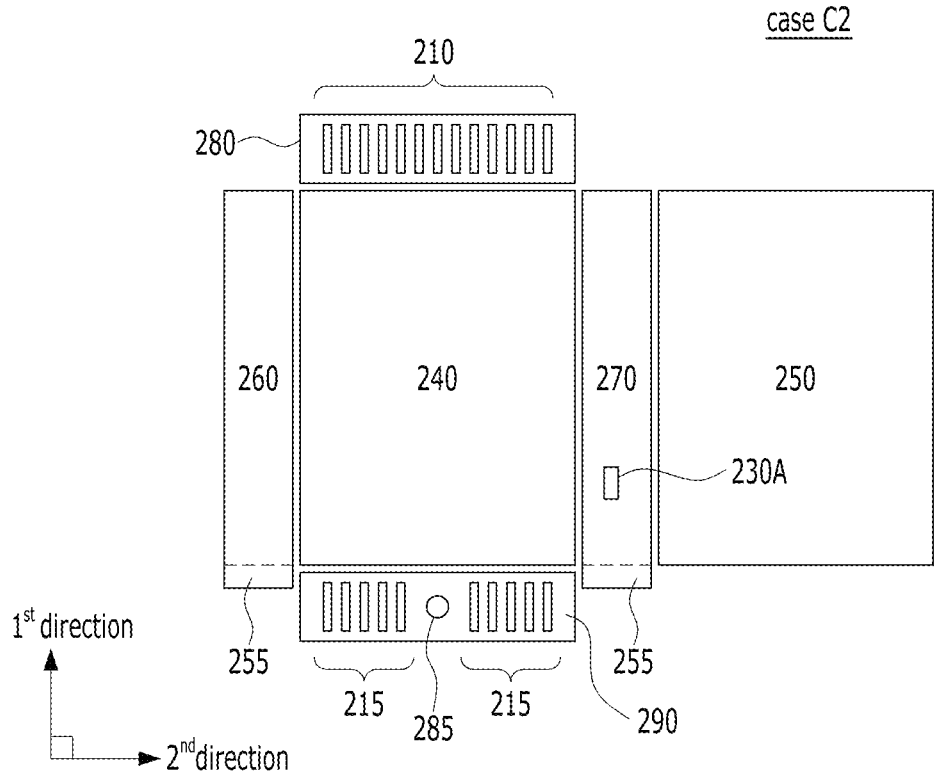

FIGS. 3A and 3B illustrate a case according to an embodiment of the present invention. Each of FIGS. 3A and 3B illustrates the case including a supporting part 255 for stably supporting the external data storage device case 200 (see FIG. 1) in a substantially vertical direction on the ground. The supporting part 255, as shown in FIG. 3A, is formed on a first short-side surface and a second short-side surface.

As shown in FIG. 3A, a case C1 may include a plurality of surfaces 240, 250, 260, 270, 280 and 290 for surrounding the memory module 100 (see FIG. 1).

The case C1 may include a first planar surface 240 and a second planar surface 250. The first planar surface 240 and the second planar surface 250 are the largest sizes in the case C1. The case C1 may include a first long-side surface 260 and a second long-side surface 270. The first long-side surface 260 and the second long-side surface 270 are parallel to each other and may contact the first planar surface 240 and the second planar surface 250. The case C1 may include a first short-side surface 280 and a second short-side surface 290. The first short-side surface 280 and the second short-side surface 290 are parallel to each other. The first short-side surface 280 and the second short-side surface 290 may contact the first planar surface 240, the second planar surface 250, the first long-side surface 260 and the second long-side surface 270.

The first long-side surface 260 and the second long-side surface 270 may extend in a first direction, and the first short-side surface 280 and the second short-side surface 290 may extend in a second direction perpendicular to the first direction.

The case C1 may include a thermal vent 210 to effectively dissipate the heat generated by the memory module 100 embedded in the external data storage device case 200. The thermal vent 210 includes a plurality of openings.

The case C1 may include an air inlet 215 for introducing air into the external data storage device case 200 from the outside. The air inlet 215 includes a plurality of openings. When the external data storage device case 200 is positioned vertically on the ground, the air inlet 215 may be positioned adjacent to the ground. The thermal vent 210 may be positioned on the opposite surface from where the air inlet 215 is positioned. Cold air introduced through the air inlet 215 at a bottom of the external data storage device case 200 may be heated by the memory module 100. The heated air may be dissipated through the thermal vent 210 positioned on a top side of the external data storage device case 200.

The case C1 may include a case coupling portion 285, which is coupled to a case stand as shown in FIGS. 5A and 5B. The external data storage device case 200 can be positioned stably in the 1o substantially vertical direction on the ground by the supporting part 255 and the case stand.

The case C1 may include a connector hole 230A exposing the connector 118 (see FIG. 1). The memory module 100 may receive power from the external device and perform data communication with the external device through the connector 118.

As shown in FIG. 3A, the thermal vent 210 may be formed on the first long-side surface 260, and the air inlet 215 may be formed on the second long-side surface 270. The case coupling portion 285 may be formed at a center of the second long-side surface 270. In some embodiments of the present invention, 'the center of a rectangular surface' may be an intersection of a first line and a second line. The first line is connecting the centers of two long line segments of the rectangular surface. The second line connects the centers of two short line segments of the rectangular surface. The center of the rectangular surface may be a symmetrical point of the rectangular surface.

The supporting part 255 may be formed on a first end portion in each of the first short-side surface 280 and the second short-side surface 290. The first end portion is adjacent to the air inlet 215 and the case coupling portion 285. The first end portion may be adjacent to the ground when the external data storage device case 200 is positioned in the substantially vertical direction on the ground.

The connector hole 230A may be formed between a center of the second short-side surface 290 and the first end portion of the second short-side surface 290. In particular, the connector hole 230A may be formed between the supporting part 255 formed on the second short-side surface 290 and the center of the second short-side surface 290.

Although not shown in FIG. 3A, the thermal vent 210 may be formed on the second long-side surface 270, and the air inlet 215 may be formed on the first long-side surface 260. The case coupling portion 285 may be formed at the center of the first long-side surface 260.

The connector hole 230A may be formed between a center of the first short-side surface 280 and the first end portion of the first short-side surface 280. In particular, the connector hole 230A may be formed between the supporting part 255 formed on the first short-side surface 280 and the center of the first short-side surface 280.

That is, the thermal vent 210 according to an embodiment of the present invention may be formed on either the first long-side surface 260 or the second long-side surface 270. The air inlet 215 and the case coupling portion 285 may be formed on the long-side surface on which the thermal vent 210 is not formed.

As shown in FIG. 3B, the supporting part 255 of a case C2 is formed on a first long-side surface and a second long-side surface. The thermal vent 210 may be formed on the first short-side surface 280, and the air inlet 215 may be formed on the second short-side surface 290. The case coupling portion 285 may be formed at a center of the second short-side surface 290.

The supporting part 255 may be formed on the first end portion of each of the first long-side surface 260 and the second long-side surface 270. The first end portion is adjacent to the air inlet 215 and the case coupling portion 285. The first end portion may be adjacent to the ground when the external data storage device case 200 is positioned in the substantially vertical direction on the ground.

The connector hole 230A may be formed between a center of the second long-side surface 270 and the first end portion of the second long-side surface 270. In particular, the connector hole 230A may be formed between the supporting part 255 formed on the second long-side surface 270 and the center of the second long-side surface 270.

Although not shown in FIG. 3B, the thermal vent 210 may be formed on the second short-side surface 290, and the air inlet 215 may be formed on the first short-side surface 280. The case coupling portion 285 may be formed at the center of the first short-side surface 280.

The connector hole 230A may be formed between the center of the first long-side surface 260 and the first end portion of the first long-side surface 260. In particular, the connector hole 230A may be formed between the supporting part 255 formed on the first long-side surface 260 and the center of the first long-side surface 260.

That is, the thermal vent 210 according to an embodiment of the present invention may be formed on either the first short-side surface 280 or the second short-side surface 290. The air inlet 215 and the case coupling portion 285 may be formed on the short-side surface on which the thermal vent 210 is not formed.

FIGS. 4A and 4B illustrate an external data storage device 1000A according to an embodiment of the present invention.

Hereinafter, with reference to FIGS. 4A and 4B as well as FIG. 3A, the external data storage device 1000A is described.

The external data storage device 1000A may include an external data storage device case 200A and a case stand 300A for supporting the external data storage device case 200A. The external data storage device case 200A includes the memory module 100 as shown in FIG. 1 and the case C1 as shown in FIG. 3A.

As shown in FIG. 4A, the case stand 300A may support the external data storage device case 200A in the substantially vertical direction on the ground. In the embodiments, the term 'substantially vertical direction on the ground' may mean that a first angle between the external data storage device case 200A and the ground is approximately 90 degrees. The first angle is a degree to which the external data storage device case 200A is tilted with respect to the ground.

When the external data storage device case 200A is positioned vertically on the ground by the case stand 300A, the first long-side surface 260 may be an uppermost surface, while the second long-side surface 270 (see FIG. 3A) may be the lowermost surface. The first long-side surface 260 is positioned farthest from the ground, while the second long-side surface 270 is closest to the ground.

The external data storage device 1000A may include the thermal vent 210 formed in the first long-side surface 260, which is the uppermost surface of the external data storage device case 200A. The external data storage device 1000A may include the air inlet 215 formed in the second long-side surface 270, which is the lowermost surface of the external data storage device case 200A.

Accordingly, the external data storage device 1000A can enhance airflow by maximizing a convection phenomenon inside the external data storage device case 200A through the thermal vent 210 formed on the uppermost surface and the air inlet 215 formed on the lowermost surface. Since the airflow through the air inlet 215 and the thermal vent 210 may be maximized, a heat dissipation effect of the external data storage device 1000A may be improved.

Further, the case coupling portion 285 coupled to the case stand 300A, is positioned at the center of the second long-side surface 270. A second angle between the external data storage device case 200A and the case stand 300A may be adjusted horizontally to the ground.

When the second angle is in a range between 60 and 90 degrees, the external data storage device case 200A may be stably supported by the case stand 300A. As shown in FIG. 4A, when the second angle is 90 degree, the external data storage device case 200A may be most stably supported by the case stand 300A.

When the supporting part 255 is formed on the first end portions of the first short-side surface 280 and the second short-side surface 290, the supporting part 255 may be positioned between a main body of the external data storage device case 200A and the ground. Since the supporting part 255 prevents the main body of the external data storage device case 200A from contacting the ground, the air inlet 215 on the second long-side surface 270 is not blocked by the ground. The amount of air entering the air inlet 215 formed on the second long-side surface 270 may be increased. Accordingly, the heat dissipation effect of the external data storage device 1000A could be enhanced.

Furthermore, when the external data storage device case 200A and the case stand 300A are coupled, the external data storage device case 200A is more stably supported by the supporting part 255 and the case stand 300A. For this purpose, the supporting part 255 may be designed to have a height substantially equal to the thickness of the case stand 300A.

Since the connector hole 230A is positioned between the supporting part 255 and the center of the first short-side surface 280, the connector hole 230A may be closer to the ground than the center of the first short-side surface 280.

Therefore, when a cable connected to the external device is connected to the external data storage device case 200A through the connector hole 230A, the center of gravity of the external data storage device case 200A, which stands in a substantially vertical direction on the ground, is lowered. Accordingly, the external data storage device 1000A can be positioned more stably in the substantially vertical direction on the ground.

Although not shown, the embodiments of the present invention may use various methods to prevent water and moisture from entering through the thermal vent 210.

For example, the external data storage device case 200A may include a bulkhead to physically block water and moisture from penetrating into the memory module 100. Additionally, a moisture-proof packing or a silicone gasket can be positioned around the thermal vent 210 to prevent water and moisture from easily entering the inside of the external data storage device case 200A. Furthermore, the opening of the thermal vent 210 may be designed with a stepped or diagonal shape to prevent water and moisture from easily entering the inside of the external data storage device case 200A. Also, a manual or 1o automatic valve may be implemented to close the valve when the external data storage device 1000A is not in use by a user, preventing water and moisture from entering.

Thus, the external data storage device case 200A, according to the embodiments of the present invention, can effectively block water and moisture from entering the memory module 100 without compromising its heat dissipation performance.

FIG. 4B illustrates the external data storage device 1000A in a non-operational state. The first angle formed between the external data storage device case 200A and the ground as well as the second angle formed between the external data storage device case 200A and the case stand 300A, may be 0 degrees.

The embodiment of the present invention solves the issue of the memory module 100 overheating by providing the external data storage device 1000A that is positioned in the substantially vertical direction on the ground. As a result, the memory module 100 can enhance its performance and longevity.

FIGS. 5A and 5B illustrate a coupling process for the external data storage device 1000A described in FIGS. 4A and 4B.

As shown in FIG. 5A, the external data storage device case 200A may include a case coupling portion 285 having a form of a cylindrically shaped opening, positioned at the center of the second long-side surface 270. In FIG. 5A, the case coupling portion 285 has the cylindrically shaped opening shape, but the embodiments of the present invention may also include a prismatic opening.

The case stand 300A may support the external data storage device case 200A so that the first planar surface 240 and the second planar surface 250, which are the largest sizes of the external data storage device case 200A, do not contact the ground. Therefore, the first planar surface 240 and the second planar surface 250 may be exposed to the air.

The case stand 300A may include a single frame segment 310 in a rod shape extended. The case stand 300A may include a stand coupling portion 320 that corresponds to the case coupling portion 285 of the external data storage device case 200A. The stand coupling portion 320 may have a cylindrically shaped protrusion and may be positioned at the center of the single frame segment 310. Additionally, the stand coupling portion 320 may have a prismatic-shaped protrusion.

By coupling the case coupling portion 285 of the external data storage device case 200A and the stand coupling portion 320 of the case stand 300A, the second angle formed between the external data storage device case 200A and the case stand 300A may be adjusted horizontally to the ground.

As shown in FIG. 5B, the supporting part 255 is formed at each end portion of the first short-side surface 280 and the second short-side surface 290. As shown in FIG. 5B, the supporting part 255 is formed at both ends of the second long-side surface 270.

The supporting part 255 may have a first width (W1) for the first direction and a second width (W2) for the second direction. The first long-side surface 260 may have a fourth width (W4) for the first direction. The case coupling portion 285, which has a cylindrically shaped opening, may have a sixth width (W6) for the first direction and a seventh width (W7) for the second direction. The supporting part 255 may protrude by the second width (W2) from two end portions of the first long-side surface 260 on which the case coupling portion 285 is formed.

The single frame segment 310 included in the case stand 300A may have an eighth width (W8) for the first direction and a ninth width (W9) for the second direction.

The ninth width (W9) of the single frame segment 310 may be equal to the second width (W2) of the supporting part 255. Accordingly, the second width (W2) of the supporting part 255 may have the same dimension as the thickness of the single frame segment 310. That is, the supporting part 255 may be designed to have a height (i.e., the second width W2) substantially equal to the thickness of the single frame segment 310.

The stand coupling portion 320 included in the case stand 300A may have a tenth width (W10) for the first direction and an eleventh width (W11) for the second direction.

The tenth width (W10) of the stand coupling portion 320 may be equal to the sixth width (W6) of the case coupling portion 285. The eleventh width (W11) of the stand coupling portion 320 may be equal to the seventh width W7 of the case coupling portion 285.

FIGS. 6A and 6B illustrate a coupled structure of the external data storage device 1000A described in FIGS. 5A and 5B.

As shown in FIG. 6A, even though the case coupling portion 285 and the stand coupling portion 320 are coupled, the supporting part 255 does not protrude beyond the single frame segment 310. Accordingly, the case stand 300A and the supporting part 255 can more stably support the external data storage device case 200A in a substantially vertical direction on the ground.

As shown in FIG. 6B, the second angle formed between the external data storage device case 200A and the case stand 300A may be adjusted from 0 to 360 degrees in a horizontal direction on the ground by a rotation axis formed by the coupling of the case coupling portion 285 and the stand coupling portion 320. When the second angle is 90 degrees, the case stand 300A can most stably support the external data storage device case 200A.

Although not shown, the external data storage device case 200A may include an angle fixture to prevent the second angle from changing due to external force or gravity after the second angle is set by the user. The angle fixture may include a silicone coating layer or a toothed structure layer to increase the friction between the case coupling portion 285 and the stand coupling portion 320. Thus, the second angle of the case coupling portion 285 and the stand coupling portion 320 can be fixed. The angle fixture may include a spring structure to adjust the rotational force between the case coupling portion 285 and the stand coupling portion 320.

Hereinafter, an external data storage device 1000B according to another embodiment of the present invention will be described with reference to FIGS. 7A to 11B. In the following description, overlap details with FIGS. 1 to 6B will be omitted.

FIGS. 7A and 7B illustrate a case C according to an embodiment of the present invention.

Each of 7A and 7B illustrates a case C3 and a case C4 including a first case coupling portion 285A and a second case coupling portion 285B. The first and second case coupling portions 285A and 285B are used for coupling the external data storage device case 200 with a case stand, to stably support the external data storage device case 200 in an approximately vertical direction on the ground.

In the following description, the cases of FIGS. 7A and 7B will be described in terms of differences from the cases C1 and C2 of FIGS. 3A and 3B.

As shown in FIG. 7A, the thermal vent 210 of the case C3 may be formed on the first short-side surface 280, and the air inlet 215 may be formed on the second short-side surface 290.

The connector hole 230A may be formed between the center of the second long-side surface 270 and the first end portion of the second long-side surface 270. The first end portion may be adjacent to the air inlet 215 and the ground when the external data storage device case 200 is positioned in the approximately vertical direction on the ground.

The first and second case coupling portions 285A and 285B may be formed at the second end portions of the first long-side surface 260 and the second long-side surface 270. The second end portion may be opposite to the first end portion. The second end portion may be far from the air inlet 215 and the ground.

FIG. 7B illustrates an example of the external data storage device case 200 in which the first short-side surface 280 and the second short-side surface 290 extend vertically on the ground, and a stability of the external data storage device case 200 is further improved.

As shown in FIG. 7B, the thermal vent 210 of the case C4 may be formed on the first long-side surface 260, and the air inlet 215 may be formed on the second long-side surface 270. The connector hole 230B may be formed between the first end portion of the second short-side surface 290 and the center of the second short-side surface 290.

The first case coupling portion 285A may be formed on the second end portion of the first short-side surface 280. The second case coupling portion 285B may be formed on the second end portion of the second short-side surface 290.

FIGS. 8A and 8B illustrate an external data storage device 1000B according to another embodiment of the present invention.

Hereinafter, with reference to FIGS. 8A and 8B as well as FIG. 7A, the external data storage device 1000B is described.

In the embodiments, the term 'approximately vertical on the ground' may mean that the first angle formed between the external data storage device case 200B and the ground is within a range between 60 and 90 degrees. The airflow, inside the external data storage device case 200B standing approximately vertically, may be significantly enhanced by the convection phenomenon. As a result, the heat dissipation amount through the thermal vent 210 may be more increased substantially. The term 'approximately vertical' may include the term 'substantially vertical' as described in FIGS. 2A to 4B. The heat dissipation amount through the thermal vent 210 may be at maximum when the first angle is approximately 90 degree.

In the embodiments, the term 'severely tilted' may mean that the first angle is within a range between 0 and 30 degrees. The structural stability of the external data storage device case 200 severely tilted may be greater than the external data storage device case 200B standing approximately vertically. However, the heat dissipation amount through the thermal vent 210 may be less than the external data storage device case 200B standing approximately vertically.

In the embodiments, the term 'normally tilted' may mean that the first angle is within a range between 30 and 60 degrees. The structural stability and the heat dissipation amount may be intermediate between the external data storage device case 200B standing approximately vertically and the external data storage device case 200 severely tilted.

As shown in FIG. 8A, the external data storage device 1000B may include an external data storage device case 200B and a case stand 300B for supporting the external data storage device case 200B. The external data storage device case 200B includes the memory module 100 as shown in FIG. 1 and the case C3 as shown in FIG. 7A. The case stand 300B is capable of supporting the external data storage device case 200B in the approximately vertical direction on the ground. The first angle between the external data storage device case 200B and the ground may depend on the second angle between the external data storage device case 200B and case stand 300B. As the second angle increases, the first angle may decrease.

The case stand 300B prevents both the first planar surface 240 and the second planar surface 250 of the external data storage device case 200B from contacting the ground. Accordingly, the first planar surface 240 and the second planar surface 250, having the largest surface area, may be exposed to a large amount of air.

When the external data storage device case 200B is positioned in the approximately vertical direction on the ground by the case stand 300B, the first short-side surface 280 may be the uppermost surface of the external data storage device case 200B, while the second short-side surface 290 may be the lowermost surface. The first short-side surface 280 is positioned farthest from the ground, while the second short-side surface 290 is positioned closest to the ground.

The external data storage device 1000B may include the thermal vent 210 on the first short-side surface 280, which is the uppermost surface of the external data storage device case 200B. The external data storage device 1000B may include the air inlet 215 formed in the second short-side surface 290, which is the lowermost surface of the external data storage device case 200B.

Accordingly, the external data storage device 1000B can enhance airflow by maximizing the convection phenomenon inside the external data storage device case 200B through the thermal vent 210 on the uppermost surface and the air inlet 215 formed on the lowermost surface. Since the airflow through the air inlet 215 and the thermal vent 210 may be maximized, the heat dissipation effect of the external data storage device 1000B may be improved.

Furthermore, the first and second case coupling portions 285A and 285B, which are coupled with the case stand 300B, are positioned at the upper portion (the second end portion) of the first long-side surface 260 and the second long-side surface 270.

As shown in FIG. 8A, since the case stand 300B prevents the main body of the external data storage device case 200B from contacting the ground, it ensures that the air inlet 215 on the second short-side surface 290 remains unblocked by the ground. Accordingly, this allows more air to enter the air inlet 215 on the second short-side surface 290, further enhancing the heat dissipation effect of the external data storage device 1000B.

The positioning of the connector hole 230B between the first end portion of the second long-side surface 270 and the center of the second long-side surface 270 means that the connector hole 230B is closer to the ground, rather than being at the center of the second long-side surface 270.

Therefore, if the cable connecting to the external device is attached to the external data storage device case 200B via the connector hole 230B, the center of gravity of the external data storage device case 200B is lowered. Accordingly, the external data storage device 1000B may be more stably positioned in the approximately vertical direction on the ground.

FIG. 8B illustrates the external data storage device 1000B when not positioned vertically on the ground in a non-operational state. At this time, both the first angle formed between the external data storage device case 200B and the ground and the second angle formed between the external data storage device case 200B and the case stand 300B may be 0 degree. When the second angle is 0 degree, the connector hole 230B may be entirely covered by the case stand 300B. Accordingly, when the external data storage device 1000B is not used by the user, the case stand 300B can prevent dust or debris from entering the external data storage device case 200B through the connector hole 230B.

The embodiment of the present invention solves the overheating of the memory module 100 by providing the external data storage device 1000B that is positioned approximately vertically on the ground. As a result, the memory module 100 can enhance its performance and longevity.

FIG. 9 illustrates a first embodiment of a coupling process of the external data storage device 1000B as shown in FIGS. 8A and 8B.

As shown in FIG. 9, the memory module 100 may include the external data storage device case 200B having the first and second case coupling portions 285A and 285B, and the case stand 300B.

In FIG. 9, the first and second case coupling portions 285A and 285B have a cylindrically shaped opening, but they may also have a prismatic opening.

The case stand 300B may include a first frame segment 310A and a second frame segment 310B, which have a rod shape extending in the first direction. The case stand 300B may include a third frame segment 310C having a rod shape extending in the second direction. The third frame segment 310C may connect the first end portions of the first and second frame segments 310A and 310B. The length of the first and second frame segments 310A and 310B may be at least 50% of the length of the first long-side surface 260 and the second long-side surface 270 of the external data storage device case 200B.

The case stand 300B may include a first stand coupling portion 320A at the second end portion of the first frame segment 310A. The first stand coupling portion 320A may correspond to the first case coupling portion 285A of the external data storage device case 200B. The case stand 300B may include a second stand coupling portion 320B at the second end portion of the second frame segment 310B. The second stand coupling portion 320B may correspond to the second case coupling portion 285B of the external data storage device case 200B. Each of the first and second stand coupling portions 320A and 320B may include a cylindrically shaped protrusion.

By coupling the first and second case coupling portions 285A and 285B of the external data storage device case 200B with the first and second stand coupling portions 320A and 320B of the case 1o stand 300B, the external data storage device case 200B is supported by the case stand 300B. The second angle formed between the external data storage device case 200B and the case stand 300B may be adjusted.

FIG. 10 illustrates a second embodiment of a coupling process of the external data storage device 1000B as shown in FIGS. 8A and 8B.

Referring to FIG. 10, the first and second case coupling portions 285A and 285B may include the cylindrically shaped openings. The first and second stand coupling portions 320A and 320B may include through holes penetrating the first and second frame segments 310A and 310B.

The first case coupling portion 285A and the first stand coupling portion 320A may be coupled by a first connecting portion 330A. The second case coupling portion 285B and the second stand coupling portion 320B may be coupled by a second connecting portion 330B. The first and second connecting portions 330A and 330B may include a hinge.

FIGS. 11A and 11B illustrate a coupled structure of the external data storage device 1000B as shown in FIGS. 8A and 8B.

As shown in FIG. 11A, the second angle formed between the external data storage device case 200B and the case stand 300B may be adjusted from 0 to 360 degrees by a rotation axis formed by the coupling of the first and second case coupling portions 285A and 285B of the external data storage device case 200B and the first and second stand coupling portions 320A and 320B of the case stand 300B. The external data storage device case 200B may include the angle fixture as described in FIG. 6B.

As shown in FIG. 11B, when the second angle is 0 degree, the connector hole 230B of the external data storage device case 200B may be entirely covered by the case stand 300B. Accordingly, when the external data storage device 1000B is not in use, the case stand 300B can prevent dust or debris from entering the external data storage device case 200B through the connector hole 230B.

Hereinafter, an external data storage device 1000C according to another embodiment of the present invention will be described with reference to FIGS. 12A to 12C.

FIGS. 12A through 12C illustrate variant embodiments of the external data storage device as shown in FIGS. 8A and 8B.

Referring to FIGS. 12A through 12C, an external data storage device 1000C may include an external data storage device case 200C and a case stand 300C for supporting the external data storage device case 200C. The external data storage device case 200C includes the memory module 100 as shown in FIG. 1 and the case C3 as shown in FIG. 7A.

As shown in FIG. 12A, the case stand 300C may include a space 500 for storing a cable 400. The cable 400 connects the external device and the connector hole 230C of the memory module 100. Accordingly, the embodiments of the present invention may increase portability of the external data storage device 1000C.

As shown in FIGS. 12A and 12B, the lengths of the first frame segment 310A and the second frame segment 310B may be shorter than the lengths of the external data storage device case 200G. The length of the first frame segment 310A and the second frame segment 310B may be more than 50% of the length of the first long-side surface 260 and the second long-side surface 270.

Therefore, a coupling point of the external data storage device case 200C and the case stand 300C may be between the center and the second end portion of the first long-side surface 260 and the second long-side surface 270. When the second angle formed between the case stand 300C and the external data storage device case 200C is 60 degree or more, the external data storage device case 200C can be more stably supported by the case stand 300C.

In particular, when the external data storage device 1000C is operated with the second angle of 45 degrees or less, the cable 400 connected to the external data storage device case 200C can lower the center of gravity of the external data storage device 1000C. Accordingly, the external data storage device 1000C can stand more stably.

As shown in FIG. 12C, when the second angle formed between the external data storage device case 200C and the case stand 300C is 0 degree, the connector hole 230C may be entirely covered by the case stand 300G. Consequently, when the user does not use the external data storage device 1000C, the case stand 300C can prevent dust or debris from entering the external data storage device case 200G through the connector hole 230C.

While the embodiments of the present invention are described using a case having a cuboidal shape, the present invention is not limited to the shape of the case.

Furthermore, while the embodiments of the present invention describe side surfaces with the longer first and second long-side surfaces 260 and 270 compared to the first and second short-side surfaces 280 and 290, the present invention is not limited to the length of the side surfaces.

In summary, the embodiments of the present invention provide external data storage devices capable of being positioned vertically on the ground, thus solving the issue of the memory module overheating. Consequently, the performance and longevity of the memory module can be significantly improved.

While the detailed description of the invention describes specific embodiments, it is of course possible to make various modifications without departing from the scope of the invention. Therefore, the scope of the invention should not be limited to the described embodiments but should be defined by the scope of the following claims as well as by things that are equivalent to the scope of these claims. Furthermore, the embodiments may be combined to form additional embodiments.

What is claimed is:

1. An external data storage device comprising:
a memory module including a plurality of semiconductor chips suitable for storing data received from an external device;
a case including a plurality of surfaces surrounding the memory module; and
a case stand suitable for supporting the case in a vertical direction on a ground,
wherein the plurality of surfaces includes:
a first planar surface and a second planar surface having the largest sizes among the plurality of surfaces;
a first long-side surface and a second long-side surface, which contact the first and second planar surfaces, are parallel in a first direction and face each other; and
a first short-side surface and a second short-side surface, which contact the first and second planar surfaces, are parallel in a second direction perpendicular to the first direction and face each other, and
wherein the case further includes:
a connector hole formed on a first end portion of either the first short-side surface or the second short-side surface, and configured to expose a connector of the memory module; and
first and second case coupling portions each having a cylindrically shaped opening formed in a second end of a corresponding long-side surface of the first and second long-side surfaces.

2. The external data storage device of claim 1,
wherein the case further includes a thermal vent, which is formed in an uppermost surface of the case to dissipate heat generated by the memory module, and
wherein the uppermost surface is the farthest from the ground among the surfaces of the case when the case is positioned vertically on the ground by the case stand.

3. The external data storage device of claim 1,
wherein the case further includes an air inlet, which is formed in a lowermost surface of the case and configured to introduce air into the case, and
wherein the lowermost surface is the closest to the ground among the surfaces of the case when the case is positioned vertically on the ground by the case stand.

4. The external data storage device of claim 1, wherein the case stand supports the case in the vertical direction on the ground such that the case is positioned in a range between 60 and 90 degrees from the ground.

5. The external data storage device of claim 2, wherein an amount of heat that is dissipated through the thermal vent is maximum when the case is positioned at 90 degrees from the ground.

6. The external data storage device of claim 1, wherein the case stand includes:

a first frame segment having a rod-shape extended in the first direction and including a first stand coupling portion corresponding to the first case coupling portion;

a second frame segment having a rod-shape extended in the first direction and including a second stand coupling portion corresponding to the second case coupling portion; and a third frame segment having a rod-shape extended in the second direction and coupling first end portions of the first and second frame segments to each other, and wherein the first and second stand coupling portions are formed in respective second end portions of the first and second frame segments.

7. The external data storage device of claim 6, wherein each of lengths of the first and second frame segments is at least 50% of a corresponding length of the first and second long-side surfaces.

8. The external data storage device of claim 6, wherein each of the first and second stand coupling portions includes a cylindrically shaped protrusion.

9. The external data storage device of claim 6, wherein each of the first and second stand coupling portions includes a through hole.

10. The external data storage device of claim 6, wherein the case stand further includes a space for storing a cable, which connects the external device to the memory module through the connector hole.

11. The external data storage device of claim 9, further comprising a connecting portion configured to connect the first case coupling portion to the first stand coupling portion and the second case coupling portion to the second stand coupling portion.

12. The external data storage device of claim 11, wherein the connecting portion includes a hinge.

13. The external data storage device of claim 1, wherein the case stand stably supports the case when the case and the case stand make an angle in a range between 60 and 90 degrees.

14. The external data storage device of claim 1, wherein the memory module includes a solid state drive (SSD) module.

15. An external data storage device comprising:

a memory module including a plurality of semiconductor chips suitable for storing data received from an external device;

a case including a plurality of surfaces surrounding the memory module; and a case stand suitable for supporting the case in a vertical direction on a ground, wherein the memory module further includes a connector for exchanging data with the external device, wherein the case further includes a connector hole for exposing the connector, and wherein the case stand entirely covers the connector hole when the case and the case stand make an angle of 0 degree.

* * * * *